United States Patent
Gunyan

(10) Patent No.: US 7,848,728 B2
(45) Date of Patent: Dec. 7, 2010

(54) BROADBAND BALANCED FREQUENCY CONVERTER

(75) Inventor: Daniel Gunyan, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1308 days.

(21) Appl. No.: 11/129,522

(22) Filed: May 13, 2005

(65) Prior Publication Data

US 2006/0258318 A1   Nov. 16, 2006

(51) Int. Cl.
*H04B 1/26* (2006.01)

(52) U.S. Cl. .................. 455/323; 455/313; 455/326

(58) Field of Classification Search .................. 455/323, 455/326, 313
See application file for complete search history.

(56) References Cited

U.S. PATENT DOCUMENTS

| | | | | | |
|---|---|---|---|---|---|
| 4,896,374 | A | * | 1/1990 | Waugh et al. | 455/326 |
| 5,060,298 | A | * | 10/1991 | Waugh et al. | 455/326 |
| 5,073,977 | A | * | 12/1991 | Kawahata | 455/330 |
| 5,373,241 | A | * | 12/1994 | Ham et al. | 324/536 |
| 2005/0070242 | A1 | * | 3/2005 | Davis | 455/293 |
| 2007/0259636 | A1 | * | 11/2007 | Fisher | 455/207 |

\* cited by examiner

*Primary Examiner*—Tuan H Nguyen

(57) ABSTRACT

A broadband balanced frequency converter ("BBFC") in signal communication with a frequency source is disclosed. The BBFC may include a mixer and an active balancing element in signal communication with the mixer.

17 Claims, 7 Drawing Sheets

BROADBAND BALANCED FREQUENCY CONVERTER

BACKGROUND OF THE INVENTION

Broadband balanced frequency converters in the low radio-frequency ("RF") to millimeter-wave frequency ("mm-wave") range are vital to many types of electronic instrumentation. Typically, a frequency converter is a device that utilizes a mixer. A mixer is a multi-port non-linear circuit or device that accepts as its input two input signals having two different frequencies and in response produces at its output four signals that include an output signal having a frequency equal to the sum of the frequencies of the input signals, a second output signal having a frequency equal to the difference between the frequencies of the input signals, and, if they are not filtered out, the original input signals. In general, the output signals will have finite bandwidth around the input signal frequencies. As an example of operation, a mixer converts signals from one frequency to another by applying a frequency reference signal (generally known as local oscillator "LO" reference signal) to one port of the mixer, and the signal to be converted (generally known as a "base-band signal") to a second port of the mixer. The sum and difference of the frequencies of the two signals are predominantly what appears at the output port of the mixer, although it is appreciated by those skilled in the art that the sum and difference of the frequencies of the harmonics of the two input signals and other higher-order products also co-exist at the mixer output port.

Generally for transmitter applications, a low frequency signal (i.e., the base-band signal) is first processed and then up-converted (i.e., modulated) through the mixer to an up-converted signal having a higher frequency (such as an intermediate frequency "IF" and/or microwave frequency), where the up-converted signal is usually amplified and transmitted. The modulation process includes combining the base-band signal with a high frequency carrier signal (that is generated from the frequency reference signal) to produce the up-converted signal (also known as a "modulated signal").

For receiver applications, the received signal (which is a modulated signal) is down-converted through the mixer by removing the high frequency carrier signal (i.e., demodulated) to produce the low frequency base-band signal, where the information is extracted.

The dynamic range of a mixer is the input power range over which the mixer is usable. On the low-input power end, it is limited by the noise figure and other system parameters such as signal to-noise ratio ("SNR" or "S/N") and receiver bandwidth. On the high-end it is limited by either the saturation level or the input level for which certain spurious signals reach unacceptable levels.

To cover a broad range of frequencies and to offer multiple transmitter/receiver channels, broadband frequency converters have utilized combinations of mixers to get adequate coverage. Unfortunately, this results in disadvantageous bulk and cost. Generally, modern instrumentation designs reflect a tendency toward remote instrument heads and higher levels of integration. To meet the design and performance requirements, there is a need for a broadband frequency converter having a mixer capable of both operating across broad RF and local oscillator frequency bandwidths and of being integrated with other like mixers into a single package.

Additionally, a balanced frequency converter is a device that utilizes a balanced mixer. Generally, electrical signals should be balanced to maximize power in many transmission situations. As such, balanced mixers have advantages over unbalanced mixers because balanced mixers generally have better power-handling capabilities, spurious rejection, noise rejection, and allow the LO and RF injection to be separated. It is appreciated by those skilled in the art that to achieve balanced LO and/or RF injection, generally a balun or hybrid is utilized to convert an unbalanced signal to a balanced one.

A balun is a device for converting an unbalanced signal to a balanced signal. When utilized in combination with a mixer, the degree of electrical balance produced by the balun is important in preventing input signal energy from exiting the wrong mixer ports. Ideally, the balun should not create large reflections or insertion losses. An example of a broad-bandwidth balun is described in U.S. Pat. No. 6,084,485, titled "Broad-bandwidth Balun with Polyiron Cones and a Conductive Rod in a Conductive Housing," issued to Bickford et al. on Jul. 4, 2000, which is herein incorporated by reference in its entirety.

Therefore, there is a need for a broadband balanced frequency converter having a balanced mixer capable of both operating across broad RF and local oscillator frequency bandwidths and being integrated with other like balanced mixers into a single package.

Examples of known mixers are shown FIGS. 1 and 2. In FIG. 1, a schematic diagram of an example of an implementation of a known mixer is shown. In FIG. 2, a schematic diagram of an example of another implementation of a known mixer similar to the example mixer shown in FIG. 1 with a Wilkinson-type splitter is shown. Both of these example mixers are described in U.S. Pat. No. 6,205,324, titled "Broadband Double-balanced Frequency Mixer," issued to J. Bickford on Mar. 20, 2001, which is herein incorporated by reference in its entirety.

Several approaches have been utilized in the past in an attempt to achieve the greatest possible bandwidth and performance while minimizing the cost and size of the designs. Generally, these approaches may be separated into either hybrid or monolithic approaches.

Hybrid approaches utilize modular components integrated into a single package and may include a mixer circuit 300 in combination with a passive balun circuit 302 as shown in FIG. 3. In FIG. 3, the balun module 302 is a passive device that balances the received frequency reference signal 304 and produces two frequency reference signals 306 that are 180 degrees out of phase. The two frequency reference signals 306 are then input into the mixer circuit 300 and mixed with a balanced input signal 308 that may be either a base-band, intermediate frequency ("IF") signal, or radio-frequency ("RF") signal. The mixer circuit 300 then produces output signal 310 that may be either a base-band, IF, or RF signal. It is appreciated by those skilled in the art that the mixer circuit 300 produces a base-band, IF, or RF signal is based on whether the mixer circuit 300 acts as a down-converter or up-converter. An example of operation of the mixer circuit 300 is described in sections 7.3 and 8.3 of "Microwave Mixers," by Maas and published in 1993 by Artech House, which is herein incorporated by reference in its entirety. Unfortunately, these hybrid approaches have the disadvantage that the balun 302 size is too large, is difficult to integrate into a multiple-mixer circuit, or has bandwidth and signal limitations.

Monolithic approaches are integrated circuits ("ICs") utilizing compatible process technologies such as, for example, a Gilbert Cell mixer or a distributed mixer. Unfortunately, these monolithic approaches have the disadvantage that monolithic mixers are generally limited by parasitic effects directly related to the device technology and, therefore, the device parasitic effects limit the bandwidth and performance of these monolithic approaches.

Therefore, there is a need for a frequency converter system that is balanced and achieves higher performance at a reduced size and cost than the previous approaches.

SUMMARY

A broadband balanced frequency converter ("BBFC") in signal communication with a frequency source is disclosed. The BBFC may include a mixer and an active balancing element in signal communication with the mixer. The active balancing element drives the mixer in a balanced mode with the frequency source.

In an example of operation as an up-converter, the BBFC may perform a process that includes creating a balanced frequency reference signal by balancing a frequency signal from a frequency source utilizing an active balancing element, and mixing the balanced frequency reference signal with a low-frequency input signal to produce the broadband output signal.

In another example of operation as a down-converter, the BBFC may perform a process that includes creating a balanced frequency reference signal by balancing a frequency signal from a frequency source utilizing an active balancing element, and mixing the balanced frequency reference signal with a high-frequency input signal to produce the low-frequency output signal.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of the preferred embodiment, reference is made to the accompanying drawings that form a part hereof, and which show, by way of illustration, a specific embodiment in which the invention may be practiced. Other embodiments may be utilized and structural changes may be made without departing from the scope of this invention.

In general, the invention is a broadband balanced frequency converter ("BBFC") that is balanced and achieves higher performance at a reduced size and cost than the previous approaches. The BBFC may be in signal communication with a frequency source and may utilize a mixer and an active balancing element in signal communication with the mixer. The active balancing element may be enabled to drive the mixer in a balanced mode with the frequency source. Additionally, the signals input into the BBFC may have a finite bandwidth.

Figure 1:
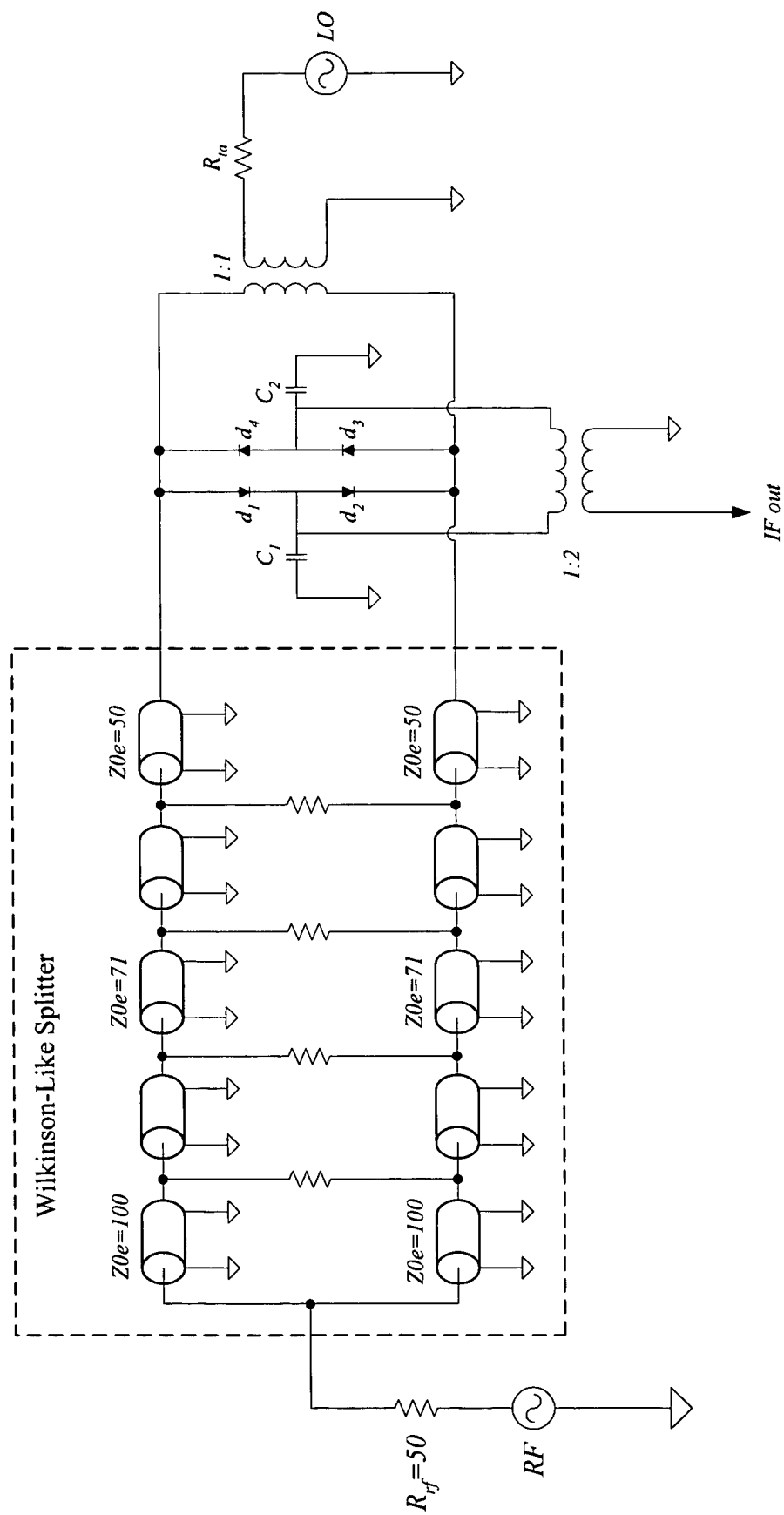
FIG. 1 is a schematic diagram of an example of an implementation of a known mixer.
Figure 2:
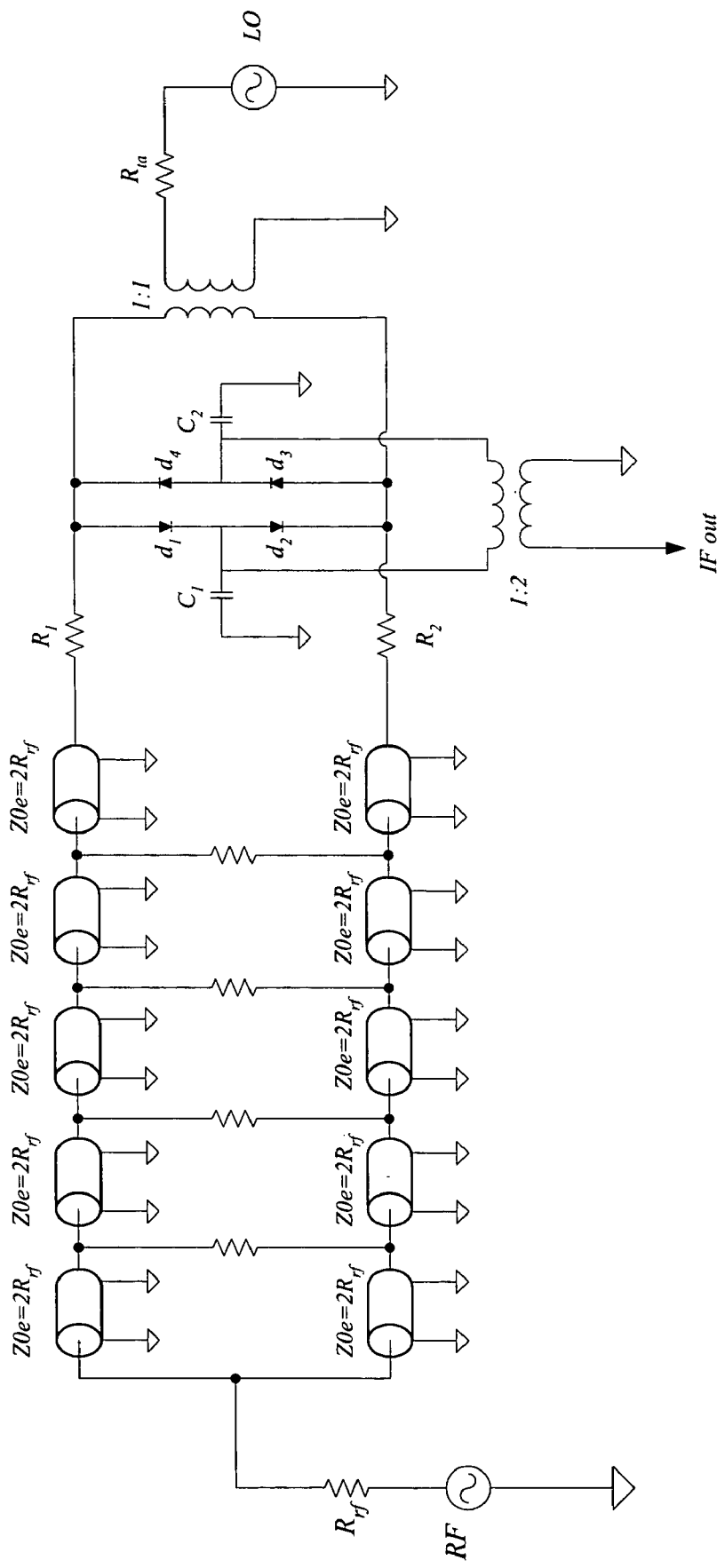
FIG. 2 is a schematic diagram of an example of another implementation of a known mixer similar to the example mixer shown in FIG. 1 with a Wilkinson-type splitter.
Figure 3:
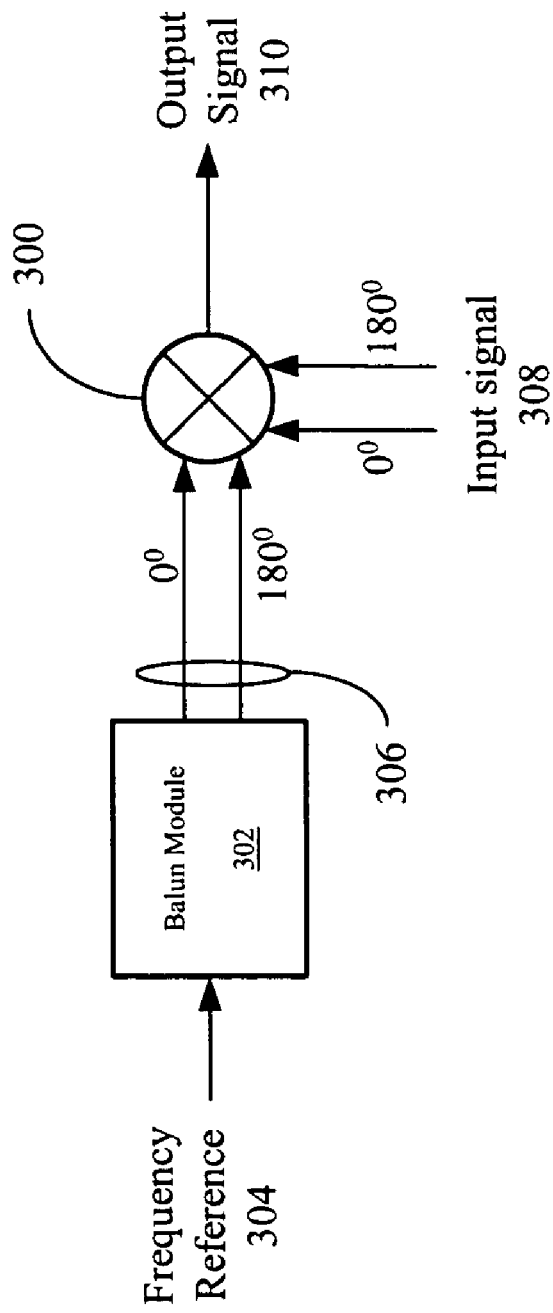
FIG. 3 is a block diagram of an example of an implementation of a known balanced mixer combination utilizing a balun module.
Figure 4:
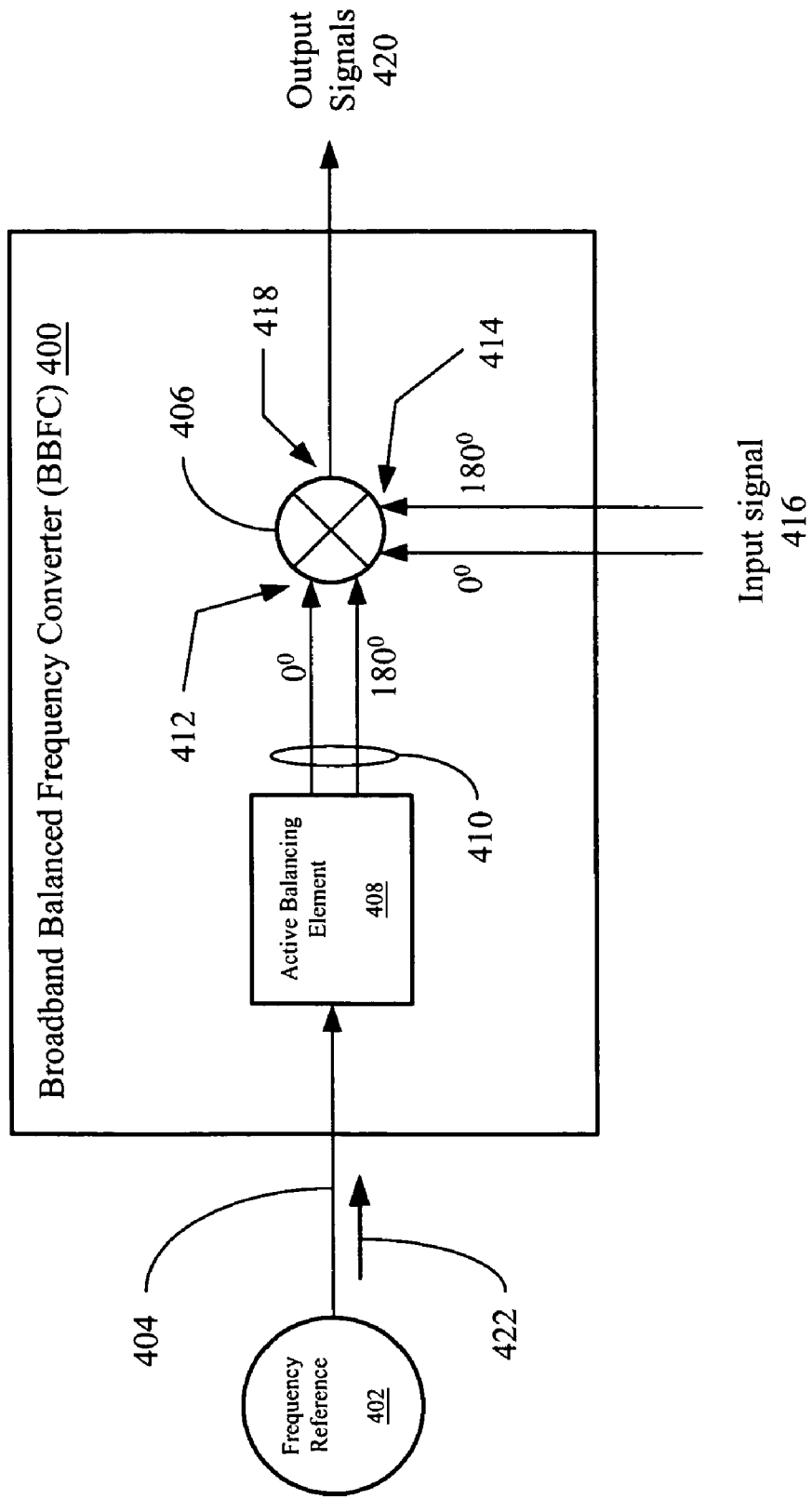
FIG. 4 is a block diagram of an example of an implementation of a broadband balanced frequency converter ("BBFC").

In FIG. 4, a block diagram of an example of an implementation of a BBFC 400 is shown. The BBFC 400 may be in signal communication with a frequency reference 402 via signal path 404, and the BBFC 400 may include a mixer 406 and an active balancing element 408 in signal communication with the mixer 406 via signal path 410. The mixer 406 may be a multi-port device that includes a first input port 412 that receives the balanced output of the active balancing element 408 via signal path 410 and a second input port 414 that receives an input signal 416. The mixer 406 produces, at an output port 418, output signals 420. Operation may also be possible with the input and output roles of 416 and 420 reversed. It is appreciated by those skilled in the art that the mixer 406 may produce a base-band, intermediate-frequency ("IF"), or radio-frequency ("RF") signal based on whether the mixer 406 acts as a down-converter or up-converter.

If the mixer 406 operates as an up-converter, the mixer 406 mixes the balanced frequency reference signal with a low-frequency input signal to produce a high-frequency output signal. If the low-frequency input signal is a base-band signal, the high-frequency output signal may be either an up-converted IF or RF signal based on the type of mixer 406. If, instead, the low-frequency input signal is an IF input signal, the high-frequency output signal may be a up-converted RF signal.

Similarly, if the mixer 406 operates as a down-converter, the mixer 406 mixes the balanced frequency reference signal with a high-frequency input signal to produce a low-frequency output signal. If the high-frequency input signal is an RF signal, the low-frequency output signal may be either a down-converted IF or base-band signal based on the type of mixer 406. If, instead, the high-frequency input signal is an IF input signal, the low-frequency output signal may be a down-converted base-band signal.

It is also appreciated that the mixer 406 may be a multi-port non-linear circuit or device that accepts as its input the balanced output of the active balancing element 408, via signal path 410 at the first input port 412, and input signal 416 at the second input port 414 where both input signals have two different frequencies. In response, the mixer 406 produces, at output port 418, four signals that include an output signal having a frequency equal to the sum of the frequencies of the input signals, a second output signal having a frequency equal to the difference between the frequencies of the input signals, and, if they are not filtered out, the original input signals.

Again, it is appreciated that the sum and difference of the frequencies of the two signals are predominantly what appears at the output port of the mixer, although it is appreciated by those skilled in the art that the sum and difference of the frequencies of the harmonics of the two input signals and other higher-order products also co-exist at the mixer output port, and can be used in the up-conversion or down-conversion process.

The active balancing element 408 may be any active device capable of providing a balancing function such as a differential amplifier. The differential amplifier may be a fully-differential amplifier, single-ended input to differential output type amplifier, or a fully-differential with unused second input port type of amplifier. The active balancing element 408 receives a frequency reference signal 422 from the frequency reference 402 and balances and produces two frequency reference signals that are 180 degrees out of phase and are passed to the first port 412 of the mixer 406 via signal path 410. The two frequency reference signals are then input into the mixer 406 and mixed with a balanced input signal 416 that may be a base-band, IF, or RF signal. The input signal 416 may be balanced to reject signal leakage from the input port 412 based on whether the mixer 406 acts as a down-converter or up-converter. The mixer 406 then produces the output signals 420 that may be either a low-frequency or high-frequency signal such as a base-band, IF or RF signal based on whether the mixer 406 acts as a down-converter or up-converter and the type of input signal 416.

Figure 5:
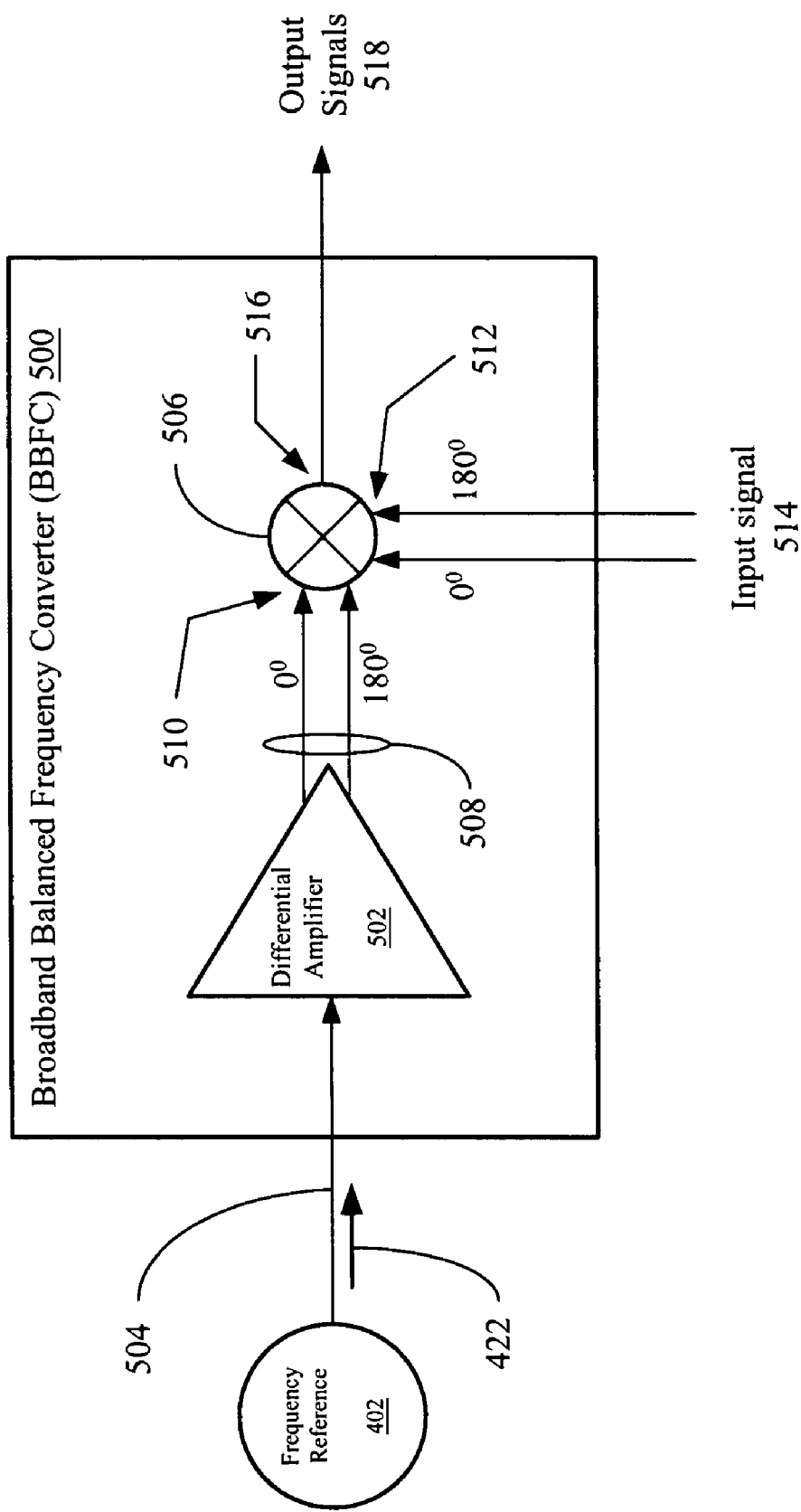
FIG. 5 is a block diagram of an example of an implementation of the BBFC of FIG. 4 utilizing a differential amplifier as an active balancing element.

In FIG. 5, a block diagram of another example of an implementation of the BBFC 500 is shown utilizing a differential amplifier 502 as an active balancing element. The BBFC 500 may be in signal communication with the frequency reference 402 via signal path 504, and the BBFC 500 may include a mixer 506 in signal communication with the differential amplifier 502 via signal path 508.

Similar to FIG. 4, the mixer 506 may be a multi-port device that includes a first input port 510 that receives the balanced output of the differential amplifier 502 via signal path 508 and a second input port 512 that receives an input signal 514. The mixer 506 produces, at an output port 516, output signals 518. Again similar to FIG. 4, the type of low-frequency or high-frequency signal output signals 518 produced is based on whether the mixer 506 acts as a down-converter or up-converter and the type of input signal 514. It is appreciated that the mixer 506 is reversible from output port 516 to second input port 512.

The differential amplifier 502 may be any broadband differential amplifier capable of driving the mixer 506 into its non-linear mixing region over the entire frequency reference 402 operating bandwidth from low RF to high millimeter ("mm-wave") frequencies, while simultaneously maintaining a balanced drive on signal path 508. The differential amplifier 502 may be a fully-differential amplifier, single-ended input to differential output type amplifier, or a fully-differential with unused second input port type of amplifier. The differential amplifier 502 and mixer 506 may be connected in signal communication utilizing hybrid interconnect technology. The mixer 506 may be a diode mixer, balanced FET mixer, or other balanced non-linear device mixer.

Figure 6:
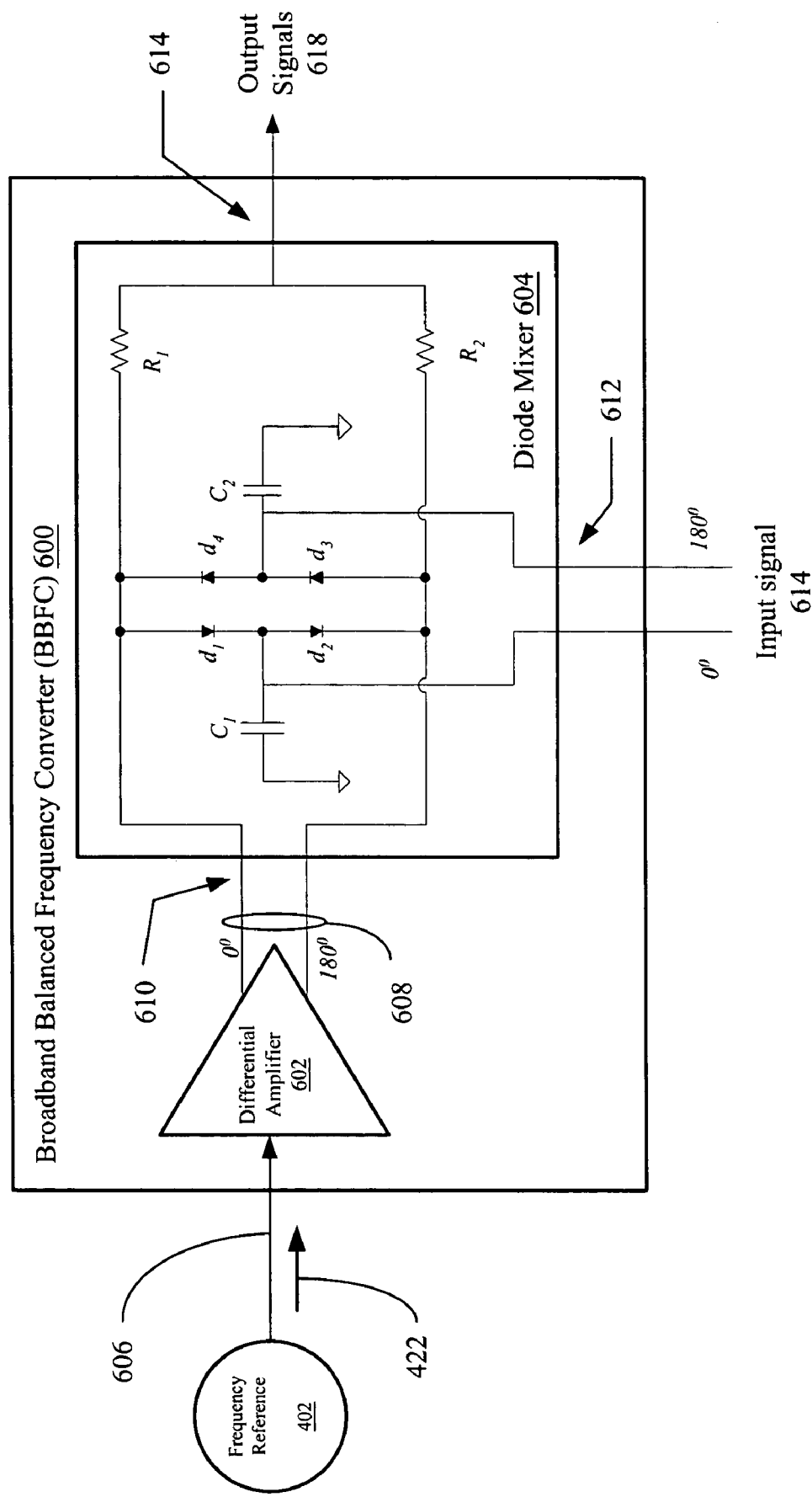
FIG. 6 is a circuit diagram of an example of an implementation of the BBFC of FIG. 4 utilizing a differential amplifier as an active balancing element and a diode mixer.

In FIG. 6, a circuit diagram of an example of an implementation of the BBFC 600 of FIG. 4 is shown utilizing a differential amplifier 602 as an active balancing element and a diode mixer 604. The BBFC 600 may be in signal communication with the frequency reference 402 via signal path 606. The differential amplifier 602 may be in signal communication with the diode mixer 604 via signal path 608.

Similar to FIGS. 4 and 5, the diode mixer 604 may be a multi-port device that includes a first input port 610 that receives the balanced output of the differential amplifier 602 via signal path 608 and a second input port 612 that receives an input signal 614. The diode mixer 604 produces, at an output port 614, output signals 618. In a general example of operation, the diode mixer 604 receives the balanced input signal at port 610. The balanced input signal at port 610 drives the diodes $d_1$, $d_2$, $d_3$, and $d_4$ of the mixer 604 into the non-linear region. This enables the diodes to modulate the balanced signal at input port 612 onto the output port 614. This operation may be reversed to modulate the signal at port 614 to port 612.

Again, the differential amplifier 602 may be any broadband differential amplifier capable of driving the diode mixer 604 into its non-linear mixing region over the entire frequency reference 402 operating bandwidth from low RF to high mm-wave frequencies, while simultaneously maintaining a balanced drive on signal path 608. The differential amplifier 602 may be a fully-differential amplifier, single-ended input to differential output type amplifier, or a fully-differential with unused second input port type of amplifier. The differential amplifier 602 and diode mixer 604 may be connected in signal communication utilizing hybrid interconnect technology.

Figure 7:
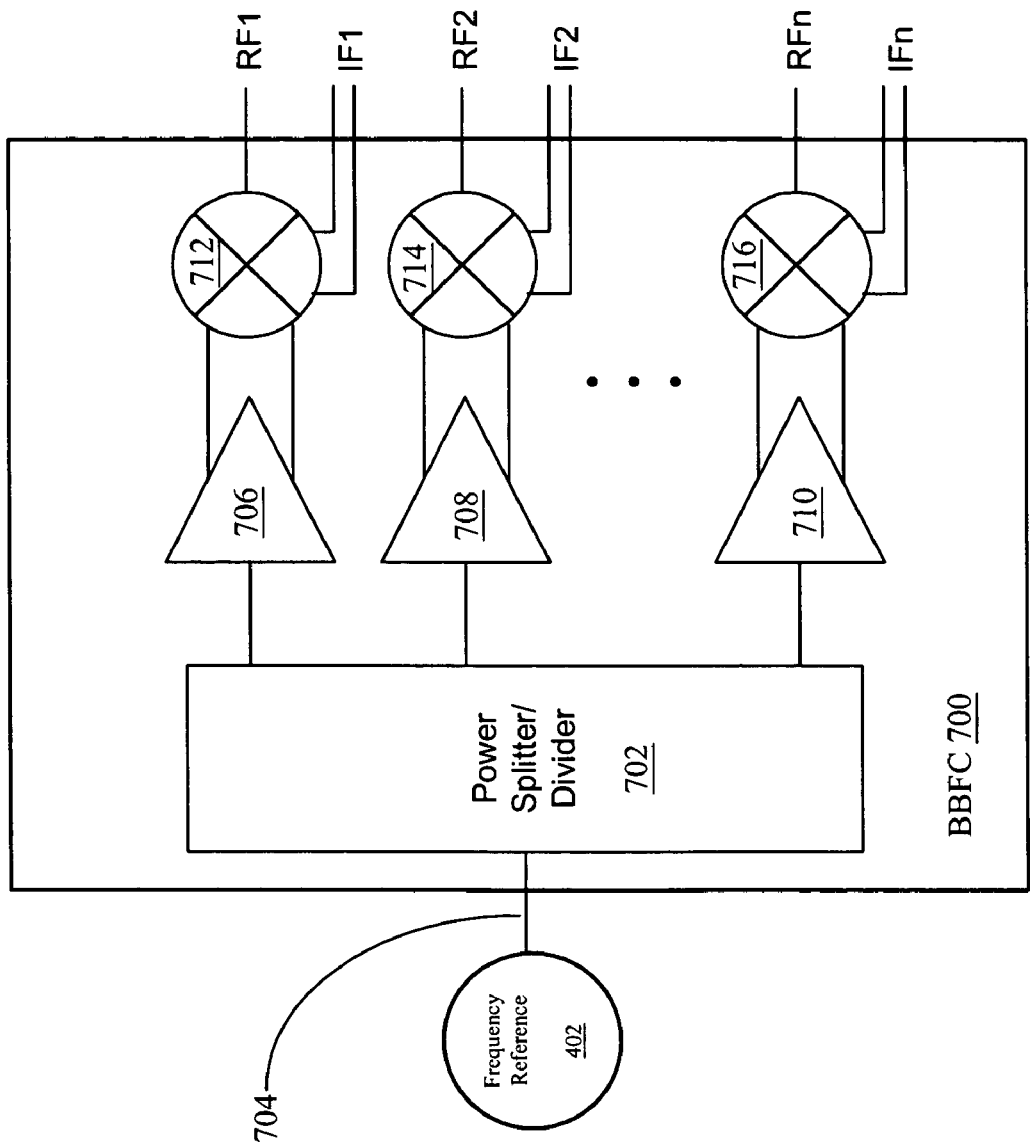
FIG. 7 is a block diagram of another example of an implementation of the BBFC utilizing a power splitting device and a plurality of active balancing elements and mixers.

In FIG. 7, a block diagram of another example of an implementation of the BBFC 700 is shown utilizing power splitting device 702 and a plurality of active balancing elements and mixers. The BBFC 700 may be in signal communication with the frequency reference 402 via signal path 704. The BBFC 700 may include the power splitting device 702, a plurality of active balancing elements 706, 708, and 710, and a plurality of mixers 712, 714, and 716. Using the power splitting device 702 with a plurality of active balancing devices enables integrating a plurality of mixers. This integration may lower the cost, size and weight of BBFC 700 modules and systems. The BBFC 700 may be combined into a single package such as a single integrated circuit ("IC"). Additionally, the BBFC 700 may be combined into a monolithic circuit. Similar to FIGS. 4, 5, and 6, the individual mixers 712, 714, and 716 of BBFC 700 may operate as an up-converter or down-converter.

While the foregoing description refers to the use of a BBFC, the subject matter is not limited to such a system. Any broadband frequency converter system that could benefit from the functionality provided by the components described above may be implemented in the BBFC.

Moreover, it will be understood that the foregoing description of numerous implementations has been presented for purposes of illustration and description. It is not exhaustive and does not limit the claimed inventions to the precise forms disclosed. Modifications and variations are possible in light of the above description or may be acquired from practicing the invention. The claims and their equivalents define the scope of the invention.

What is claimed:

1. A broadband balanced frequency converter ("BBFC") in signal communication with a frequency source, the BBFC comprising:
   a mixer;
   an active balancing element in signal communication with the mixer, wherein the active balancing element drives the mixer in a balanced mode with the frequency source;
   a power splitting device in signal communication with the active balancing element and the frequency source, wherein the power splitting device receives a frequency reference signal from the frequency source and in response splits the frequency reference signal into a plurality of split frequency signals, wherein a first split frequency reference signal of the plurality of split frequency signals is passed to the active balancing element;
a second mixer; and
a second active balancing element in signal communication with both the second mixer and power splitting device, wherein the second active balancing element receives a second frequency reference signal from the plurality of split frequency signals and in response drives the second mixer in a balanced mode.

2. The BBFC of claim 1, wherein the mixer and the active balancing element are combined in a monolithic circuit.

3. The BBFC of claim 1, wherein the power splitting device, mixer, second mixer, active balancing element, and second active balancing element are combined in a monolithic circuit.

4. The BBFC of claim 1, wherein the mixer is a diode mixer.

5. The BBFC of claim 1, wherein the mixer is an active balancing mixer.

6. The BBFC of claim 1, wherein the mixer, second mixer, active balancing element, and second active balancing element are combined in a monolithic circuit.

7. The BBFC of claim 1, wherein the active balancing element is a differential amplifier.

8. The BBFC of claim 7, wherein the mixer is a diode mixer.

9. The BBFC of claim 7, wherein the mixer is an active balancing mixer.

10. The BBFC of claim 9, wherein the active balancing mixer is a Gilbert mixer.

11. A method for up-converting a low-frequency input signal to a broadband output signal with a broadband balanced frequency converter ("BBFC"), the method comprising:
creating a balanced frequency reference signal by balancing a frequency reference signal from a frequency source with an active balancing element;
mixing the balanced frequency reference signal with the low-frequency input signal to produce the broadband output signal splitting the frequency reference signal into a plurality of split frequency signals, wherein a first split frequency reference signal of the plurality of split frequency signals is balanced to create the balanced frequency reference signal;
creating a second balanced frequency reference signal by balancing a second frequency reference signal from the plurality of split frequency signals with a second active balancing element; and
mixing the second balanced frequency reference signal with another low-frequency input signal to produce another broadband output signal.

12. The method of claim 11, wherein creating the balanced frequency reference signal includes differentially amplifying the frequency reference signal.

13. The method of claim 12, wherein mixing includes mixing the balanced frequency reference signal and low-frequency input signal with a diode mixer.

14. The method of claim 12, wherein mixing includes mixing the balanced frequency reference signal and low-frequency input signal with an active balancing mixer.

15. A method for down-converting a high-frequency input signal to a low-frequency output signal with a broadband balanced frequency converter ("BBFC"), the method comprising:
creating a balanced frequency reference signal by balancing a frequency reference signal from a frequency source with an active balancing element;
mixing the balanced frequency reference signal with the high-frequency input signal to produce the low-frequency output signal;
splitting the frequency reference signal into a plurality of split frequency signals, wherein a first split frequency reference signal of the plurality of split frequency signals is balanced to create the balanced frequency reference signal;
creating a second balanced frequency reference signal by balancing a second frequency reference signal from the plurality of split frequency signals with a second active balancing element; and
mixing the second balanced frequency reference signal with another high-frequency input signal to produce another low-frequency output signal.

16. The method of claim 15, wherein creating the balanced frequency reference signal includes differentially amplifying the frequency reference signal.

17. The method of claim 16, wherein mixing includes mixing the balanced frequency reference signal and high-frequency input signal with an active balancing mixer.

* * * * *